United States Patent
Kawaguchi

(10) Patent No.: US 10,283,326 B2
(45) Date of Patent: May 7, 2019

(54) ION GENERATOR AND METHOD OF CONTROLLING ION GENERATOR

(71) Applicant: Sumitomo Heavy Industries Ion Technology Co., Ltd., Tokyo (JP)

(72) Inventor: Hiroshi Kawaguchi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 210 days.

(21) Appl. No.: 15/348,761

(22) Filed: Nov. 10, 2016

(65) Prior Publication Data
US 2017/0140898 A1    May 18, 2017

(30) Foreign Application Priority Data
Nov. 13, 2015  (JP) ................. 2015-222862

(51) Int. Cl.
*H01J 37/32* (2006.01)
*B08B 9/08* (2006.01)
(Continued)

(52) U.S. Cl.
CPC ............ *H01J 37/3244* (2013.01); *B08B 9/08* (2013.01); *H01J 37/08* (2013.01); *H01J 37/3178* (2013.01);
(Continued)

(58) Field of Classification Search
CPC ......... H01J 2237/055; H01J 2237/0492; H01J 2237/022; H01J 2237/3365;
(Continued)

(56) References Cited

U.S. PATENT DOCUMENTS 4,754,200 A * 6/1988 Plumb ................... H01J 27/022
                                                                        250/423 R
6,319,734 B1 * 11/2001 Matsuda ........... H01L 21/26513
                                                                        438/14
(Continued)

FOREIGN PATENT DOCUMENTS

JP      H11-317174 A    11/1999
JP      3405321 B2       5/2003
(Continued)

*Primary Examiner* — Alexander Markoff
(74) *Attorney, Agent, or Firm* — Michael Best & Friedrich LLP

(57) ABSTRACT

An ion generator includes an ion source control unit that controls a gas supply unit and a plasma excitation source in accordance with a current ion source condition and a new ion source condition to be employed subsequent to the current ion source condition, a retention time obtaining unit that obtains retention time for the current ion source condition, and a pre-treatment condition setting unit that sets a pre-treatment condition defining a pre-treatment for forming a surface layer region suitable for the new ion source condition on a plasma chamber inner wall based on the current ion source condition, the retention time, and the new ion source condition. The ion source control unit is configured to control the gas supply unit and the plasma excitation source in accordance with the pre-treatment condition when the current ion source condition is changed to the new ion source condition.

12 Claims, 10 Drawing Sheets

(51) Int. Cl.
*H01J 37/08* (2006.01)
*H01J 37/317* (2006.01)

(52) U.S. Cl.
CPC .. *H01J 37/32357* (2013.01); *H01J 37/32412* (2013.01); *H01J 37/32422* (2013.01); *H01J 37/32614* (2013.01); *H01J 37/32862* (2013.01); *H01J 2237/022* (2013.01); *H01J 2237/0492* (2013.01); *H01J 2237/055* (2013.01); *H01J 2237/3365* (2013.01)

(58) Field of Classification Search
CPC ............. H01J 37/3244; H01J 37/32422; H01J 37/32412; H01J 37/32862; H01J 37/3178; H01J 37/08; B08B 9/08
See application file for complete search history.

(56) References Cited

U.S. PATENT DOCUMENTS

| | | | |
|---|---|---|---|
| 6,978,187 B1 | 12/2005 | Ryskoski | |
| 7,947,129 B2 | 5/2011 | Murata et al. | |
| 7,977,222 B2 | 7/2011 | Koezuka et al. | |
| 7,985,948 B2 * | 7/2011 | Bonner | G01N 30/7233 250/281 |
| 8,253,097 B2 * | 8/2012 | Ishimaru | G01N 30/461 250/288 |
| 2005/0126487 A1 * | 6/2005 | Tabuchi | C23C 16/24 118/723 E |
| 2005/0260354 A1 | 11/2005 | Singh et al. | |
| 2010/0181505 A1 * | 7/2010 | Krempel-Hesse | H01J 37/08 250/505.1 |
| 2014/0231242 A1 * | 8/2014 | Brassier | H01J 37/32009 204/192.11 |
| 2015/0037511 A1 * | 2/2015 | Ray | H01J 37/08 427/523 |
| 2016/0233048 A1 * | 8/2016 | Chang | H01J 37/08 |
| 2017/0250084 A1 * | 8/2017 | Byl | H01J 37/08 |

FOREIGN PATENT DOCUMENTS

| | | |
|---|---|---|
| JP | 2007-043107 A | 2/2007 |
| JP | 2007-538413 A | 12/2007 |
| JP | 4374487 B2 | 12/2009 |
| JP | 4662711 B2 | 3/2011 |
| JP | 2014-026955 A | 2/2014 |

* cited by examiner

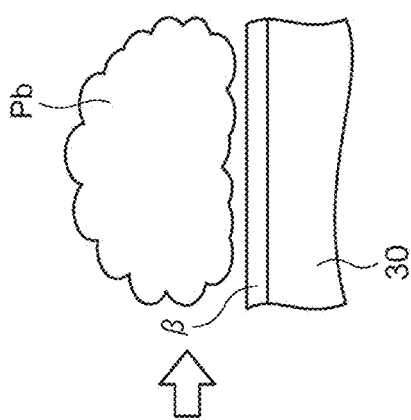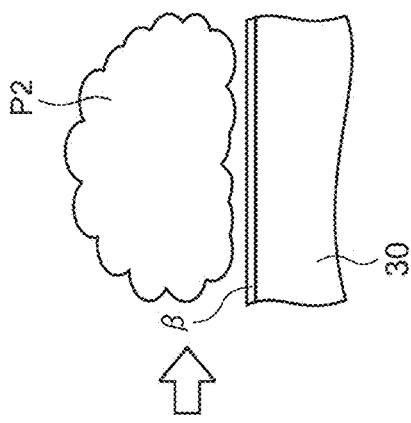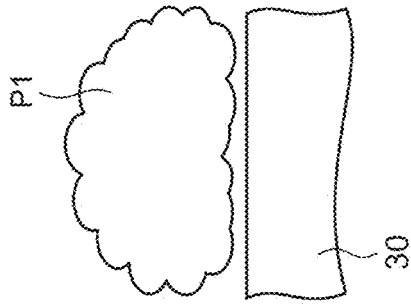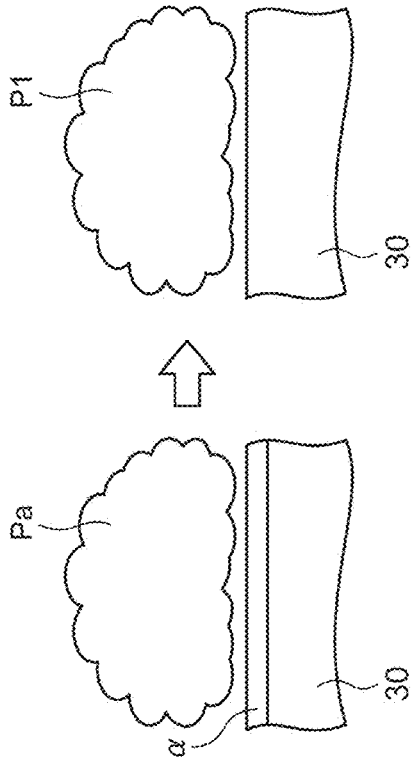

120

122

ION GENERATOR AND METHOD OF CONTROLLING ION GENERATOR

RELATED APPLICATION

Priority is claimed to Japanese Patent Application No. 2015-222862, filed on Nov. 13, 2015, the entire content of which is incorporated herein by reference.

BACKGROUND OF THE INVENTION

1. Field of the Invention

The present invention relates to an ion generator and a method of controlling an ion generator.

2. Description of the Related Art

An ion generator is used as an ion source to be mounted on an apparatus, such as an ion implanter, of irradiating ions with a workpiece. In such an ion irradiating apparatus, to perform a certain irradiation process and another irradiation process with different recipes (for example, each recipe having different ion species and different energy), switching ion beam conditions between these processes is generally performed. Switching ion beam conditions normally goes with switching ion source conditions to be employed in the ion generator.

Immediately after switching ion source conditions, the quality of the ion beam may not be sufficiently stable. For this reason, for a while after starting employing new ion source conditions, one needs to wait until the ion beam is stable. This wait time is desirably shortened to improve productivity of the ion irradiating apparatus.

SUMMARY OF THE INVENTION

An illustrative purpose of an embodiment of the present invention is to provide an ion generator and a method of controlling the same useful for improvement of productivity of an ion irradiating apparatus.

According to an embodiment of the present invention, an ion generator includes a plasma chamber that includes a plasma chamber inner wall to be exposed to a plasma, a gas supply unit that is configured to supply the plasma chamber with a source gas, a plasma excitation source that is configured to excite the source gas supplied to the plasma chamber into a plasma state, an ion source control unit that is configured to control the gas supply unit and the plasma excitation source in accordance with a current ion source condition and a new ion source condition to be employed subsequent to the current ion source condition, a retention time obtaining unit that is configured to obtain a retention time for the current ion source condition, and a pre-treatment condition setting unit that is configured to set a pre-treatment condition defining a pre-treatment for forming on the plasma chamber inner a surface layer region suitable for the new ion source condition wall, the pre-treatment condition being set based on the current ion source condition, the retention time, and the new ion source condition. The ion source control unit is configured to control the gas supply unit and the plasma excitation source in accordance with the pre-treatment condition when the current ion source condition is changed to the new ion source condition.

According to an embodiment of the present invention, a method of controlling an ion generator is provided. The ion generator includes a plasma chamber that includes a plasma chamber inner wall to be exposed to a plasma, a gas supply unit that is configured to supply the plasma chamber with a source gas, and a plasma excitation source that is configured to excite the source gas supplied to the plasma chamber into a plasma state. The method includes controlling the gas supply unit and the plasma excitation source in accordance with a current ion source condition, obtaining a retention time for the current ion source condition, setting a pre-treatment condition defining a pre-treatment for forming on the plasma chamber inner wall a surface layer region suitable for a new ion source condition to be employed subsequent to the current ion source condition, the pre-treatment condition being set based on the current ion source condition, the retention time, and the new ion source condition, and controlling the gas supply unit and the plasma excitation source in accordance with the pre-treatment condition when the current ion source condition is changed to the new ion source condition.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 5A to 5D show state changes of the inner wall of the arc chamber when certain ion source conditions are switched to other ion source conditions according to an embodiment of the present invention;

DETAILED DESCRIPTION OF THE INVENTION

The invention will now be described by reference to the preferred embodiments. This does not intend to limit the scope of the present invention, but to exemplify the invention.

A detailed description will now be given of the embodiments of the present invention with reference to the attached drawings. Like numerals represent like elements so that the description will be omitted accordingly. The structure described below is by way of example only and does not limit the scope of the invention.

Figure 1:
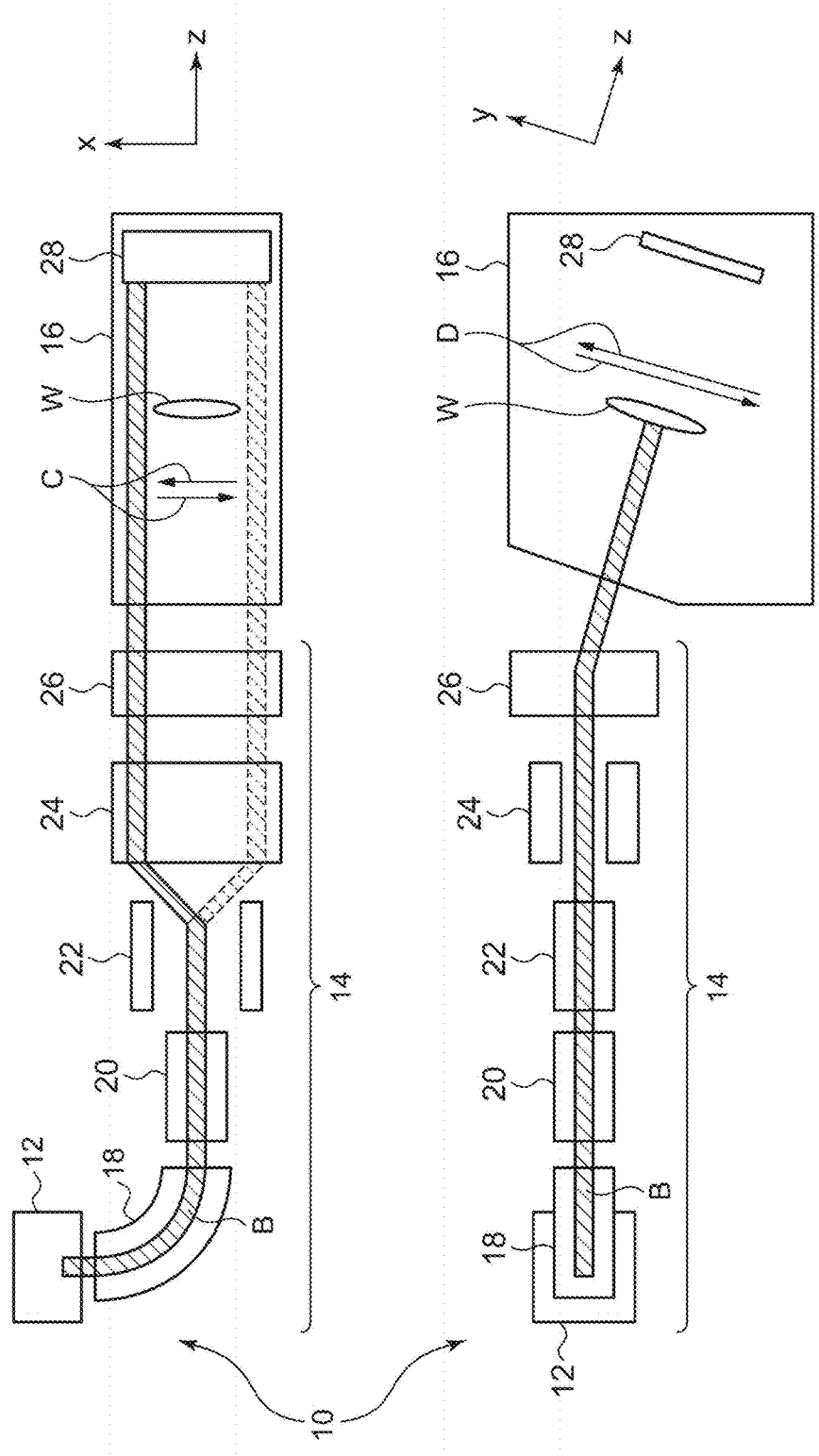
FIG. 1 schematically shows an ion implanter according to an embodiment of the present invention.

FIG. 1 schematically shows an ion implanter 10 according to an embodiment of the present invention. Shown on top in FIG. 1 is a top view showing the schematic structure of the ion implanter 10, and shown at the bottom in FIG. 1 is a side view showing the schematic structure of the ion implanter 10.

The ion implanter 10 is configured to implant ions on the surface of a workpiece in a vacuum space. For example, the workpiece may be a substrate W (e.g., a semiconductor wafer). Therefore, the workpiece may be referred to as a substrate W or a semiconductor wafer for convenience in the following description, but that does not intend to limit a target of implantation to a specific object.

The ion implanter 10 is configured to radiate an ion beam B over the entire surface of the substrate W by using at least one of mechanical scan and beam scan. For convenience of the description, the direction in which an ion beam B is designed to travel is defined as the z direction and a plane perpendicular to the z direction will be defined as the xy plane. As described later, the workpiece is scanned by the ion beam B in the x direction and the direction perpendicular to the z direction and the x direction is defined as the y direction. Therefore, beam scan is performed in the x direction and mechanical scan is performed in the y direction.

The ion implanter 10 is provided with an ion source 12, a beam line device 14, and an implantation chamber 16. The ion source 12 is configured to provide the ion beam B to the beam line device 14. The beam line device 14 is configured to transport ions from the ion source 12 to the implantation chamber 16. The ion implanter 10 is provided with a vacuum pumping system (not shown) for providing a desired vacuum environment in the ion source 12, the beam line device 14, and the implantation chamber 16.

As shown, the beam line device 14 is provided with a mass analyzer magnet device 18, a beam focusing/defocusing device 20, a deflection scanning device 22, a beam collimator 24 such as a P lens (parallelizing lens), and an angle energy filter 26 in the stated order in a direction from upstream to downstream. In this specification, the term "upstream" means being toward the ion source 12 and the term "downstream" means being toward the implantation chamber 16.

The mass analyzer magnet device 18 is provided downstream of the ion source 12 and is configured to select necessary ion species from the ion beam B extracted from the ion source 12 by mass analysis. The beam focusing/defocusing device 20 is provided with a focusing lens such as a Q lens (quadruple lens) and is configured to focus or defocus the ion beam B to have a desired cross sectional shape.

The deflection scanning device 22 is configured to provide beam scanning functionality. The deflection scanning device 22 scans the ion beam B in the x direction. Thus, the ion beam B is scanned over a scanning range in the x direction that is longer than the width in the y direction. Referring to FIG. 1, arrow C indicates beam scan and its scanning range by way of example. The ion beams B at one end of the scanning range and at the other end are indicated by the solid line and the broken line, respectively. For the purpose of clarity, the ion beam B is shaded in the illustration.

The beam collimator 24 is configured to cause the scanned ion beam B to travel in a parallel direction. The angle energy filter 26 is configured to analyze the energy of the ion beam B and deflect ions having the necessary energy downward, guiding the deflected ions to the implantation chamber 16. Thus, the beam line device 14 supplies the implantation chamber 16 with the ion beam B to irradiate the substrate W with.

The implantation chamber 16 is provided with an object holder (not shown) configured to support one or a plurality of substrates W and provide the substrate W with movement (so-called mechanical scan) in the y direction relative to the ion beam B, as needed. Arrow D in FIG. 1 indicates mechanical scan. The implantation chamber 16 is provided with a beam stopper 28 at the end of the beam line. If the substrate W is not located on the ion beam B, the ion beam B is incident on the beam stopper 28.

In one embodiment, the ion implanter 10 may be configured to provide the implantation chamber 16 with an ion beam having a cross section elongated in a direction perpendicular to the z direction. For example, the width of the ion beam in the x direction in this case is longer than the width in the y direction. An ion beam having an elongated cross section such as this may be referred to as a ribbon beam. In an alternative embodiment, the ion implanter 10 may be configured not to scan an ion beam and to provide the implantation chamber 16 with an ion beam having a spot-shaped cross section.

Figure 2:
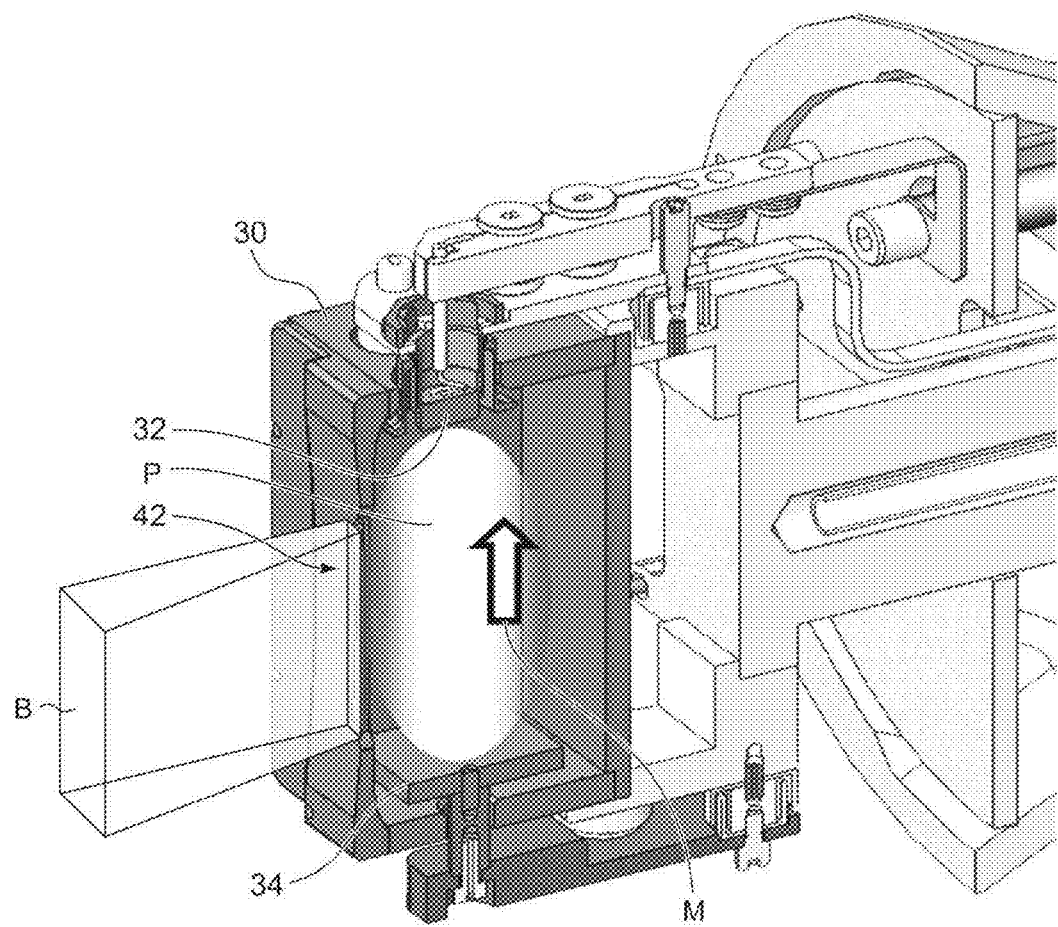
FIG. 2 is a perspective cross sectional view schematically showing a part of an ion source according to an embodiment of the present invention.
Figure 3:
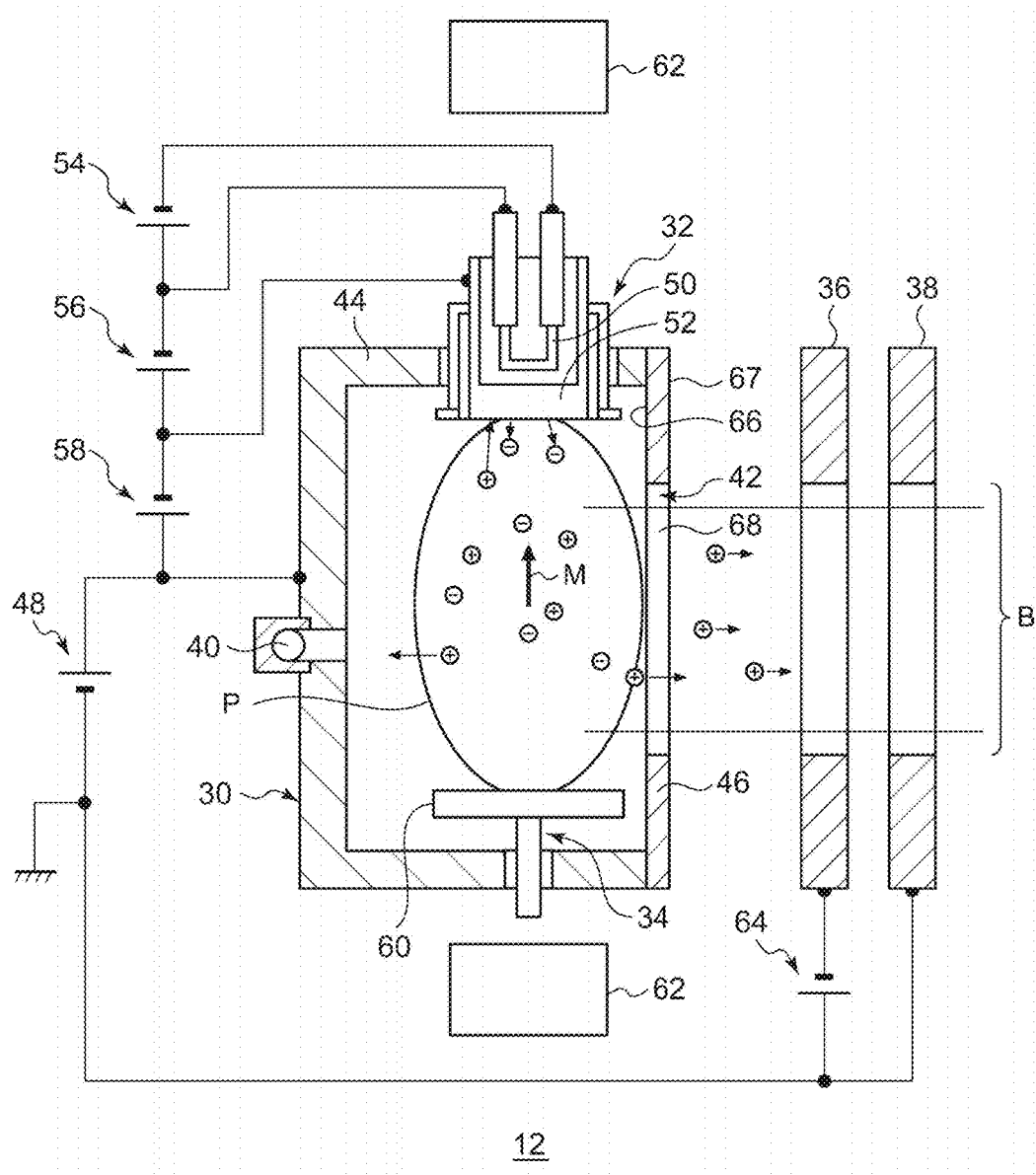
FIG. 3 schematically shows a cross section of an ion source according to an embodiment of the present invention along with elements related to the ion source.

FIG. 2 is a perspective cross sectional view schematically showing a part of the ion source 12 according to an embodiment of the present invention. FIG. 3 schematically shows a cross section of the ion source 12 according to an embodiment of the present invention along with elements related to the ion source 12.

The ion source 12 is an indirectly heated cathode ion source and is provided with an arc chamber 30, a thermionic emission unit 32, a repeller 34, a first extraction electrode 36, a second extraction electrode 38, and various power supplies.

The arc chamber 30 has a substantially cuboid box shape. The arc chamber 30 is elongated in one direction. Hereinafter, the direction in which the arc chamber 30 is elongated will be referred to as the longitudinal direction of the arc chamber 30. The longitudinal direction is the vertical direction on the paper surface of FIGS. 2 and 3.

The arc chamber 30 is formed of a high melting point material. More specifically, the arc chamber 30 is formed of a high melting point metal such as tungsten (W), molybdenum (Mo), and tantalum (Ta), or an alloy thereof, or graphite (C), etc. This makes the arc chamber hard to melt even in an environment in which the arc chamber is heated inside to a high temperature.

The thermionic emission unit 32 is provided at one longitudinal end of the arc chamber 30. The repeller 34 is provided at the other longitudinal end of the arc chamber 30. The repeller 34 is opposite to the thermionic emission unit 32. For convenience of the description, the thermionic emission unit 32 is provided toward the top of the arc chamber 30 and the repeller 34 is provided toward the bottom of the arc chamber 30.

One of the sides of the arc chamber 30 is provided with a gas introduction port 40 for introducing a source gas. The other side of the arc chamber 30 is formed with a beam extraction slit 42 provided as an opening through which the ion beam B is extracted.

Noble gas, hydrogen ($H_2$), hydrides such as phosphine ($PH_3$), arsine ($AsH_3$), fluorides such as boron trifluoride ($BF_3$), germanium tetrafluoride ($GeF_4$), chlorides such as indium trichloride ($InCl_3$), or other halides are used as a source gas. Substances containing oxygen atoms (O) such as carbon dioxide ($CO_2$), carbon monoxide (CO), oxygen ($O_2$), etc. may alternatively be used as a source gas.

The arc chamber 30 is provided with a chamber body 44 and a slit member 46. The beam extraction slit 42 is formed through the slit member 46. The chamber body 44 is a box member that opens at one side thereof. The slit member 46 is a lid mounted to the open side of the chamber body 44. By mounting the slit member 46 to the chamber body 44, the plasma chamber of the ion source 12 is formed. The thermionic emission unit 32, the repeller 34, and the gas introduction port 40 are provided in the chamber body 44.

The arc chamber 30 is connected to the positive terminal of a high voltage power supply 48. Therefore, a positive high voltage is applied to the chamber body 44 and the slit member 46 by the high voltage power supply 48.

The beam extraction slit 42 is an elongated slit extending from top to bottom of the slit member 46. The beam extraction slit 42 is referred to as a front slit. A vertically elongated hole such as this has a larger area than a small circular hole so that the amount of ion beam extracted from the ion source 12 can be increased.

For convenience of the description, the direction in which the beam extraction slit 42 extends will be referred to as the longitudinal direction of the slit. The longitudinal direction of the slit corresponds to the longitudinal direction of the arc chamber 30. The longitudinal direction of the slit is perpendicular to the direction of beam extraction from the ion source 12. Hereinafter, the direction perpendicular to the longitudinal direction of the slit and the beam extraction direction will be referred to as slit width direction. Therefore, the cross section shown in FIGS. 2 and 3 is a cross section of the beam extraction slit 42, exposing a plane parallel to the longitudinal direction of the slit and the beam extraction direction. Referring to FIG. 3, the longitudinal direction of the slit is the vertical direction, the beam extraction direction is the horizontal direction, and the slit width direction is the direction perpendicular to the paper surface.

The thermionic emission unit 32 emits thermoelectrons into the arc chamber 30 and includes a filament 50 and a cathode 52. The thermionic emission unit 32 is inserted into a cathode mounting hole of the chamber body 44 and is secured to the arc chamber 30 in an insulated state. Further, a filament power supply 54, a cathode power supply 56, and an arc power supply 58 are provided in association with the thermionic emission unit 32.

The filament 50 is heated by the filament power supply 54 and generates thermoelectrons at an end thereof. (Primary) thermoelectrons generated by the filament 50 are accelerated by the cathode electric field of the cathode power supply 56. (Primary) thermoelectrons collide with the cathode 52 so as to heat the cathode 52 with the heat generated upon collision. The heated cathode 52 generates (secondary) thermoelectrons.

An arc voltage is applied by the arc power supply 58 between the cathode 52 and the arc chamber 30. The (secondary) thermoelectrons are accelerated by the arc voltage. The (secondary) thermoelectrons are discharged into the arc chamber 30 as beam electrons having sufficient energy to dissociate gas molecules. The beam electrons are located in a range substantially limited by the magnetic field M so that ions are primarily generated in that range. Beam electrons reach by diffusion the inner wall of the arc chamber 30, the beam extraction slit 42, the cathode 52, and the repeller 34 and are finally lost in these wall surfaces.

The repeller 34 includes a repeller plate 60. The repeller plate 60 is provided facing the cathode 52 so as to be substantially parallel to the cathode 52. The repeller plate 60 repels electrons in the arc chamber 30 to cause the electrons to remain in the region where a plasma P is generated, thereby increasing the ion generation efficiency.

A magnetic field generator 62 is provided in the ion source 12. The magnetic field generator 62 is provided outside the arc chamber 30. The magnetic field generator 62 is provided with a pair of source magnetic coils, one of which is above the arc chamber 30 and the other is below the arc chamber 30. The magnetic field generator 62 applies a magnetic field M in the arc chamber 30. The magnetic field M is applied in the longitudinal direction of the arc chamber 30.

Beam electrons emitted from the cathode 52 to the arc chamber 30 travel reciprocally between the cathode 52 and the repeller 34 along the magnetic field M. Reciprocating beam electrons collide with and dissociate source gas molecules introduced into the arc chamber 30 and produce ions, thereby generating the plasma P in the arc chamber 30. Since the arc chamber 30 is elongated, the plasma P is also elongated.

The first extraction electrode 36 is provided outside and adjacent to the arc chamber 30. The first extraction electrode 36 is positioned across a gap from the slit member 46 in the beam extraction direction. The second extraction electrode 38 is provided adjacent to the first extraction electrode 36 in a direction away from the slit member 46. The second extraction electrode 38 is positioned at a gap from the first extraction electrode 36 in the beam extraction direction.

As shown, each of the first extraction electrode 36 and the second extraction electrode 38 is provided with an opening aligned with the beam extraction slit 42 to guide the ion beam B. These openings have a vertically elongated shape like the beam extraction slit 42. The first extraction electrode 36 and the second extraction electrode 38 are formed of, for example, stainless steel, graphite, molybdenum, or tungsten.

The first extraction electrode 36 is connected to a suppression power supply 64. The suppression power supply 64 is provided to apply a voltage to the first extraction electrode 36 that is negative relative to the second extraction electrode 38. The second extraction electrode 38 is grounded. The first extraction electrode 36 may also be referred to as a suppression electrode. The second extraction electrode 38 may also be referred to as a ground electrode.

The beam is extracted by an electric field produced at the beam extraction slit 42 in accordance with the voltage applied between the first extraction electrode 36 and the slit member 46. The electric field extracts the ion beam B from the plasma via the beam extraction slit 42. The ion beam B travels past the first extraction electrode 36 and the second extraction electrode 38 and is transported to the implantation chamber 16 by the beam line device 14 before being projected to the substrate W.

Figure 4:
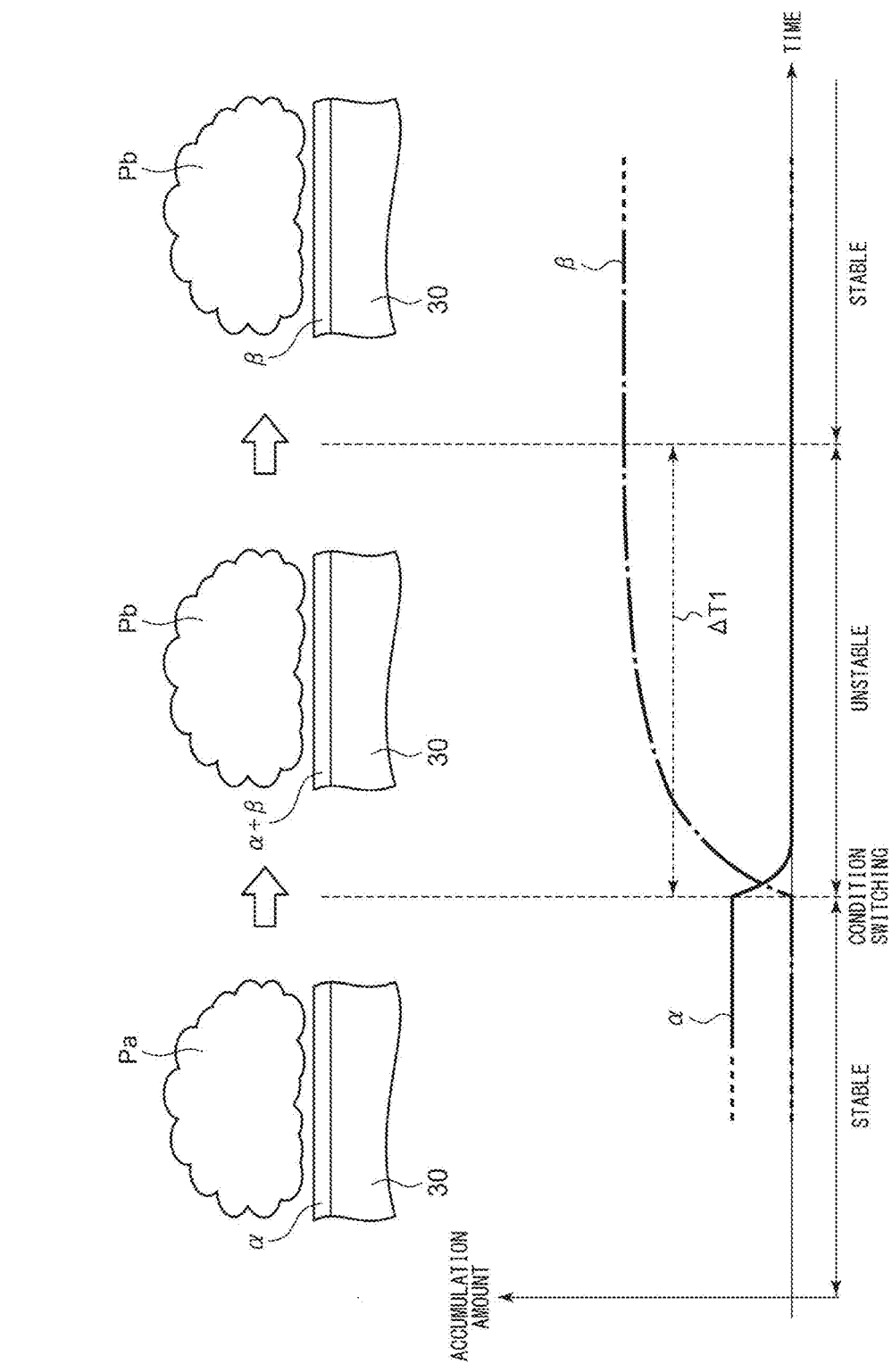
FIG. 4 shows state changes of an inner wall of an arc chamber when certain ion source conditions are switched to other ion source conditions.

FIG. 4 shows state changes of the inner wall of the arc chamber 30 when certain ion source conditions are switched to other ion source conditions. The ion source conditions are operating conditions for the ion source 12 and include parameters such as a kind and a flow rate of gas to be used, power to be supplied for plasma excitation (for example, an arc current and an arc voltage), and an applied magnetic field. When the ion source conditions are switched, at least one of these parameters is changed. Hereinbelow, for convenience of description, conditions before switching are referred to as "current ion source conditions" as is appropriate since they are ion source conditions currently employed while conditions after switching are referred to as "new ion source conditions" as is appropriate since they are ion source conditions to be employed subsequently.

The upper left part of FIG. 4 shows a state of the inner wall of the arc chamber 30 when the operation of the ion source 12 has been continued for a sufficient period of time under the current ion source conditions. Also, the upper center part of FIG. 4 shows a state of the inner wall of the arc chamber 30 immediately after the current ion source conditions have been switched to the new ion source conditions, and the upper right part of FIG. 4 shows a state of the inner wall of the arc chamber 30 when the operation of the ion source 12 has been continued for a sufficient period of time under the new ion source conditions since then. The lower part of FIG. 4 shows changes of a substance forming amount (for example, a thickness of a substance layer) on the inner wall of the arc chamber 30 when the current ion source conditions are switched to the new ion source conditions.

According to consideration of the present inventors, a different substance can be formed on the inner wall of the arc chamber 30 in accordance with the ion source conditions. For example, as shown in the upper left part of FIG. 4, under the current ion source conditions, first plasma Pa is generated in the arc chamber 30, which causes formation of a first substance α on the inner wall. When the current ion source conditions are switched to the new ion source conditions, second plasma Pb, which is different from the first plasma Pa, is generated in the arc chamber 30 as shown in the upper center part of FIG. 4. Since it is immediately after switching, the first substance α still remains on the inner wall of the arc chamber 30. As shown in the upper right part of FIG. 4, when a sufficient period of time has passed since the start of employment of the new ion source conditions, a second substance β is formed on the inner wall of the arc chamber 30 by the second plasma Pb.

In this manner, switching of the ion source conditions goes with state transition of the inner wall of the arc chamber 30. As shown in the lower part of FIG. 4, the first substance α formed under the current ion source conditions is gradually removed from the inner wall, and the second substance β is gradually formed on the inner wall under the new ion source conditions. The first substance α removed from the inner wall seems to be discharged outside the arc chamber 30 together with the ion beam. The second substance β is saturated when a certain amount thereof is formed on the inner wall.

In such a transition state, the quality of the ion beam extracted from the ion source 12 is not sufficiently stable. For this reason, for a while after starting employing the new ion source conditions, one needs to wait until the ion beam is stable. This wait time ΔT1 requires considerable time depending on the combination of the current ion source conditions and the new ion source conditions. Implantation of the ion implanter 10 cannot be started until the wait time ΔT1 passes. Thus, the wait time for ion beam stabilization along with switching of the ion source conditions is desirably shortened to improve productivity of the ion implanter 10.

Under such circumstances, for the purpose of reducing the wait time for ion beam stabilization, the present inventors have arrived at a configuration described below.

FIGS. 5A to 5D show state changes of the inner wall of the arc chamber 30 when certain ion source conditions are switched to other ion source conditions according to an embodiment of the present invention.

An operation for forming on the inner wall of the arc chamber 30 a surface layer region suitable for the new ion source conditions is executed at the time of switching from the current ion source conditions to the new ion source conditions. Hereinbelow, this operation will be referred to as a pre-treatment as is appropriate. Pre-treatment conditions defining the pre-treatment are preset in accordance with the combination of the current ion source conditions and the new ion source conditions, and the pre-treatment is automatically executed at the time of switching of the ion source conditions.

FIG. 5A shows a state of the inner wall of the arc chamber 30 when the operation of the ion source 12 has been continued for a sufficient period of time under the current ion source conditions in a similar manner to the upper left part of FIG. 4. Thus, the first plasma Pa is generated over the inner wall of the arc chamber 30, which causes formation of the first substance α on the inner wall.

FIG. 5B shows a first pre-treatment for removing from the inner wall of the arc chamber 30 the first substance α formed on the inner wall under the current ion source conditions by means of a reaction with plasma (for example, plasma etching). In the first pre-treatment, plasma P1 for the first pre-treatment (hereinbelow referred to as first pre-treatment plasma as is appropriate) is generated in the arc chamber 30, and the first substance α is thereby removed from the inner wall.

FIG. 5C shows a second pre-treatment for pre-forming on the inner wall of the arc chamber 30 the second substance β to be formed on the inner wall under the new ion source conditions by means of a reaction with plasma (for example, plasma deposition). In the second pre-treatment, plasma P2 for the second pre-treatment (hereinbelow referred to as second pre-treatment plasma as is appropriate) is generated in the arc chamber 30, and the second substance β is thereby formed on the inner wall.

After the second substance β has been rapidly accumulated on the inner wall of the arc chamber 30 by the second pre-treatment, the operation of the ion source 12 under the new ion source conditions is started as shown in FIG. 5D. Since the second substance β is pre-formed on the inner wall of the arc chamber 30, the stable ion beam can be extracted even immediately after starting employing the new ion source conditions.

Figure 6:
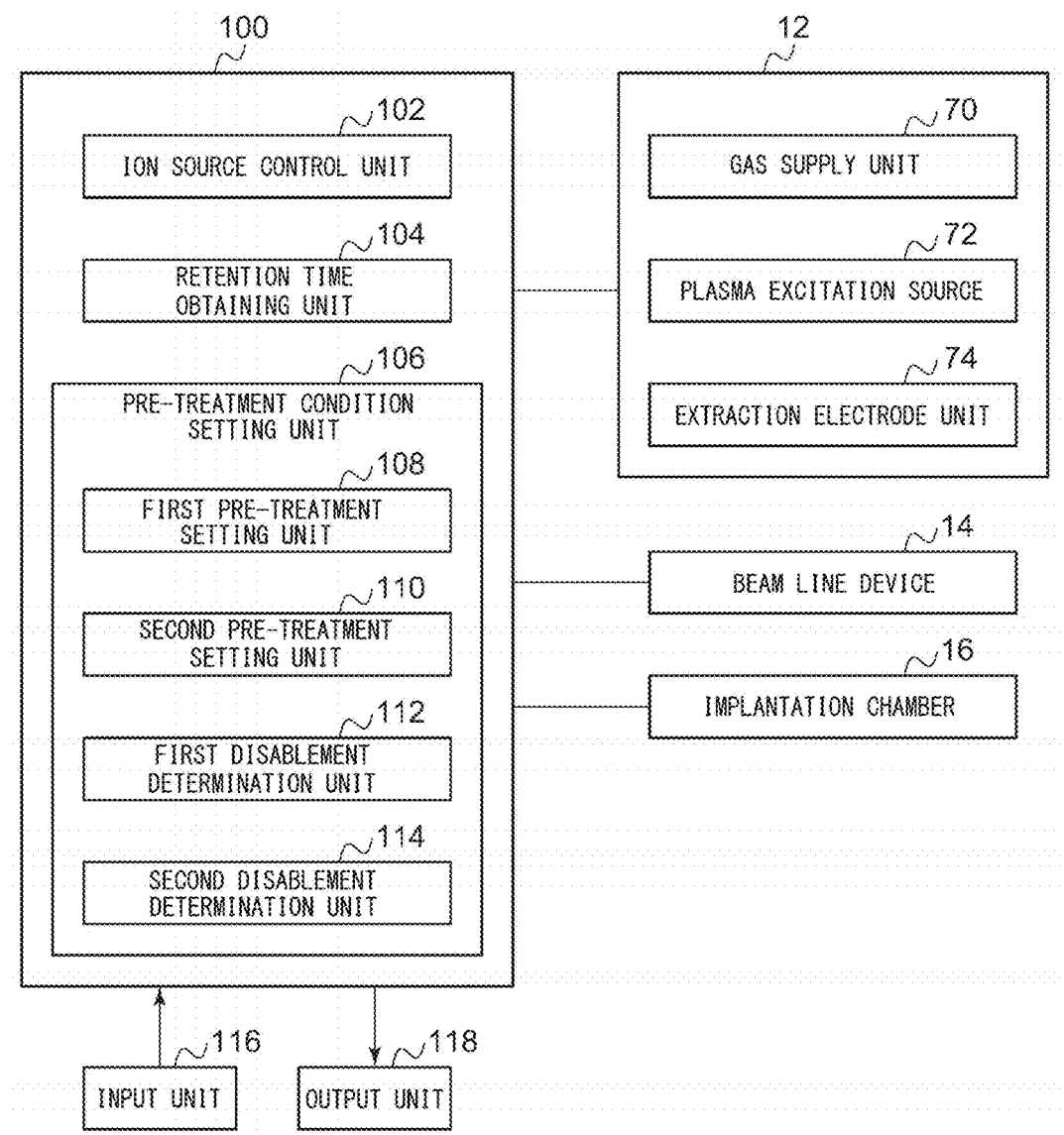
FIG. 6 schematically shows a control unit of an ion implanter according to an embodiment of the present invention.

FIG. 6 schematically shows a control device 100 of the ion implanter 10 according to an embodiment of the present invention. The control device 100 is achieved by hardware, software, or a combination thereof. FIG. 6 also schematically shows a partial relevant configuration of the ion implanter 10.

The ion source 12 includes a gas supply unit 70, a plasma excitation source 72, and an extraction electrode unit 74. The gas supply unit 70 is configured to supply the arc chamber 30 with the source gas. The gas supply unit 70 includes a source gas source (not shown) and supplies the interior of the arc chamber 30 with the source gas through the gas inlet 40 shown in FIG. 3. The gas supply unit 70 includes a mass flow controller (not shown) configured to adjust the flow rate of the source gas to be supplied to the interior of the arc chamber 30.

The plasma excitation source 72 is configured to excite the source gas supplied to the arc chamber 30 into a plasma state. The plasma excitation source 72 includes the thermionic emission unit 32 and the magnetic field generator 62 shown in FIG. 3. The extraction electrode unit 74 is configured to extract ions from the arc chamber 30 and includes the first extraction electrode 36 and the second extraction electrode 38 shown in FIG. 3.

The control device 100 includes an ion source control unit 102, a retention time obtaining unit 104, and a pre-treatment condition setting unit 106. The pre-treatment condition setting unit 106 includes a first pre-treatment setting unit 108, a second pre-treatment setting unit 110, a first disablement determination unit 112, and a second disablement determination unit 114. The control device 100 also includes an input unit 116 and an output unit 118.

The ion source control unit 102 is configured to control the gas supply unit 70 and the plasma excitation source 72 in accordance with the current ion source conditions and the new ion source conditions. The ion source control unit 102 is also configured to control the gas supply unit 70 and the plasma excitation source 72 in accordance with the pre-treatment conditions at the time of switching from the current ion source conditions to the new ion source conditions.

The retention time obtaining unit 104 is configured to obtain retention time for the current ion source conditions.

The pre-treatment condition setting unit 106 is configured to set the pre-treatment conditions based on the current ion source conditions, the retention time, and the new ion source conditions. The first pre-treatment setting unit 108 is configured to set first pre-treatment conditions defining the first pre-treatment based on the current ion source conditions and the retention time. The first pre-treatment conditions include first power to be supplied for plasma excitation (for example, an arc current), a kind and a flow rate of first source gas, and operation time for the first pre-treatment. The second pre-treatment setting unit 110 is configured to set second pre-treatment conditions defining the second pre-treatment based on the new ion source conditions. The second pre-treatment conditions include second power to be supplied for plasma excitation, a kind and a flow rate of second source gas, and operation time for the second pre-treatment.

The first disablement determination unit 112 is configured to determine whether or not the first pre-treatment setting unit 108 is disabled based on the current ion source conditions, the retention time, and/or the new ion source conditions. The second disablement determination unit 114 is configured to determine whether or not the second pre-treatment setting unit 110 is disabled based on the current ion source conditions, the retention time, and/or the new ion source conditions.

The input unit 116 is configured to receive input related to control of the ion implanter 10 from a user or another apparatus. Examples of the input unit 116 are an input means, such as a mouse and a keyboard, configured to receive input from a user, and/or a communication means configured to communicate with another apparatus. The output unit 118 is configured to output information related to control of the ion implanter 10, and an example thereof is an output means such as a display and a printer. The input unit 116 and the output unit 118 are respectively connected to the control device 100 to enable communication.

The control device 100 may be implemented as a device or a circuit such as a CPU and a memory of a computer as a hardware configuration and may be implemented as a computer program or the like as a software configuration. In FIG. 6, functional blocks achieved through a combination thereof are shown. It is to be understood by those skilled in the art that these functional blocks can be achieved in various manners through combination of hardware and software.

An effective way to remove from the inner wall of the arc chamber 30 a reactive substance such as the first substance $\alpha$ formed on the inner wall is to reduce supply of the source gas for the reactive substance. In addition to this, gas dedicated to cleaning, which is different from the source gas, may be supplied to the arc chamber 30.

The gas supply unit 70 may supply, in the first pre-treatment, the arc chamber 30 with the first source gas, which is different from the source gas to be used under the current ion source conditions. The first source gas is typically noble gas, halogen, or mixed gas containing the noble gas or the halogen. The noble gas is difficult to react with the inner wall of the arc chamber 30. Thus, facilitating the removing effect by means of sputtering on the surface of the inner wall is expected. By using highly reactive gas such as halogen, facilitating the removing effect by means of etching of the surface of the inner wall is expected. Also, since lowering pressure inside the arc chamber 30 facilitates evaporation of the first substance $\alpha$, making the flow rate of the gas to be supplied to the arc chamber 30 relatively low is also effective.

Another effective way to remove the reactive substance from the inner wall of the arc chamber 30 is to raise the temperature of the arc chamber 30. Raising the temperature accelerates evaporation of the first substance $\alpha$. Thus, the first supply power to the plasma excitation source 72 in the first pre-treatment may be higher than the supply power to the plasma excitation source 72 under the current ion source conditions.

Since implantation of the ion implanter 10 is stopped during execution of the first pre-treatment, the operation time for the first pre-treatment is desirably short to improve productivity of the ion implanter 10. The forming amount of the first substance $\alpha$ under the current ion source conditions depends on the retention time for the current ion source conditions. Thus, the pre-treatment condition setting unit 106 may set the operation time for the first pre-treatment based on the retention time for the current ion source conditions.

Figure 7:
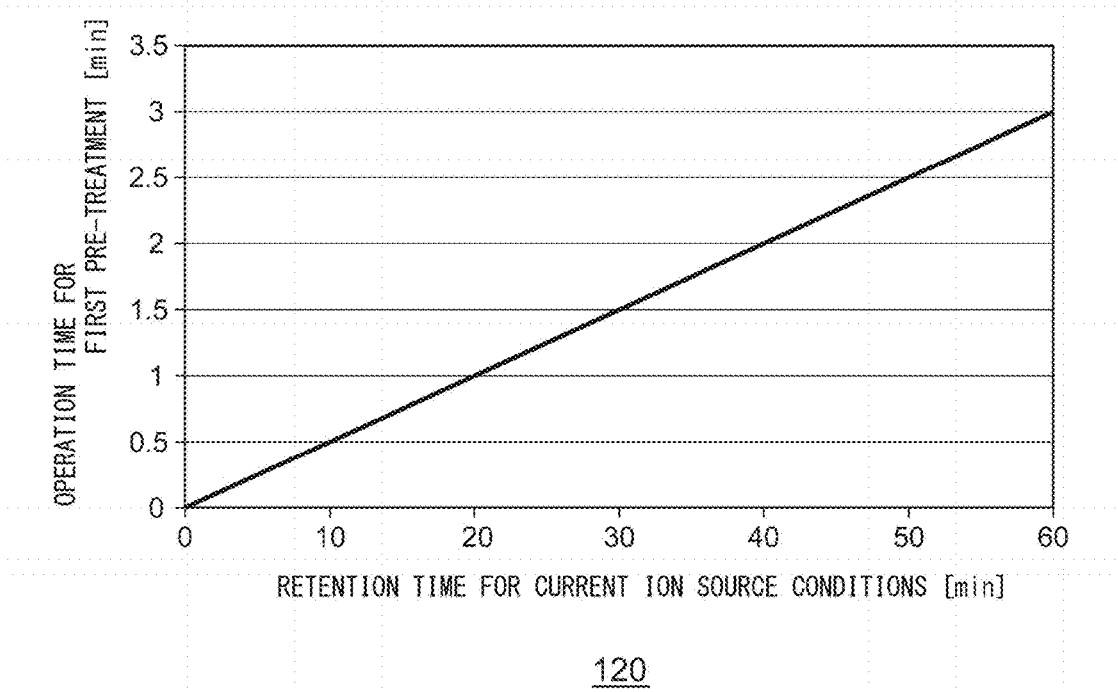
FIG. 7 shows relationship between retention time for current ion source conditions and operation time for a first pre-treatment according to an embodiment of the present invention.

FIG. 7 shows relationship between the retention time for the current ion source conditions and the operation time for the first pre-treatment according to an embodiment of the present invention. A first pre-treatment operation time table 120 shown in FIG. 7 defines operation time for the first pre-treatment corresponding to retention time for the current ion source conditions. In the first pre-treatment operation time table 120 shown in the figure, the longer the retention time for the current ion source conditions is, the longer the operation time for the first pre-treatment is. The first pre-treatment operation time table 120 is prepared in advance and is stored in the control device 100. The first pre-treatment operation time table 120 can be set as is appropriate based on empirical knowledge of a designer, experiments and simulations performed by the designer, or the like.

On the other hand, to form a reactive substance such as the second substance β on the inner wall of the arc chamber 30 in the second pre-treatment, the gas supply unit 70 typically supplies the arc chamber 30 with the second source gas, which is in the same gas kind as that of the source gas to be used under the new ion source conditions. Since an effective way to facilitate formation is to increase the flow rate of the source gas, the flow rate of the second source gas is preferably higher than the flow rate of the source gas under the new ion source conditions.

Another effective way to form the reactive substance on the inner wall of the arc chamber 30 is to lower the temperature of the arc chamber 30. Lowering the temperature accelerates formation of the second substance β. Thus, the second supply power to the plasma excitation source 72 in the second pre-treatment may be lower than the supply power to the plasma excitation source 72 under the new ion source conditions.

Figure 8:
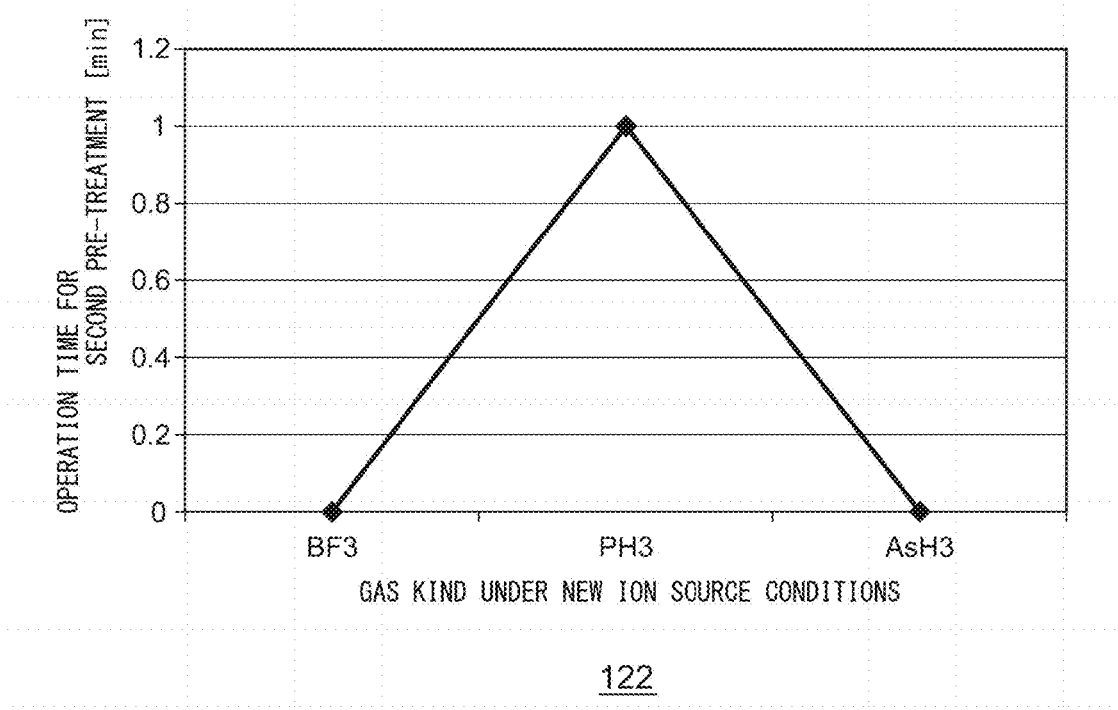
FIG. 8 shows relationship between a gas kind to be used under new ion source conditions and operation time for a second pre-treatment according to an embodiment of the present invention.

FIG. 8 shows relationship between the gas kind to be used under the new ion source conditions and the operation time for the second pre-treatment according to an embodiment of the present invention. A second pre-treatment operation time table 122 shown in FIG. 8 defines operation time for the second pre-treatment corresponding to a gas kind to be used under the new ion source conditions. In the second pre-treatment operation time table 122 shown in the figure, the second pre-treatment is executed in a case in which gas containing phosphorus (for example, $PH_3$) is used under the new ion source conditions but is not executed in another case (for example, a case in which $BF_3$ or $AsH_3$ is used). The second pre-treatment operation time table 122 is prepared in advance and is stored in the control device 100. The second pre-treatment operation time table 122 can be set as is appropriate based on empirical knowledge of a designer, experiments and simulations performed by the designer, or the like.

Figure 9:
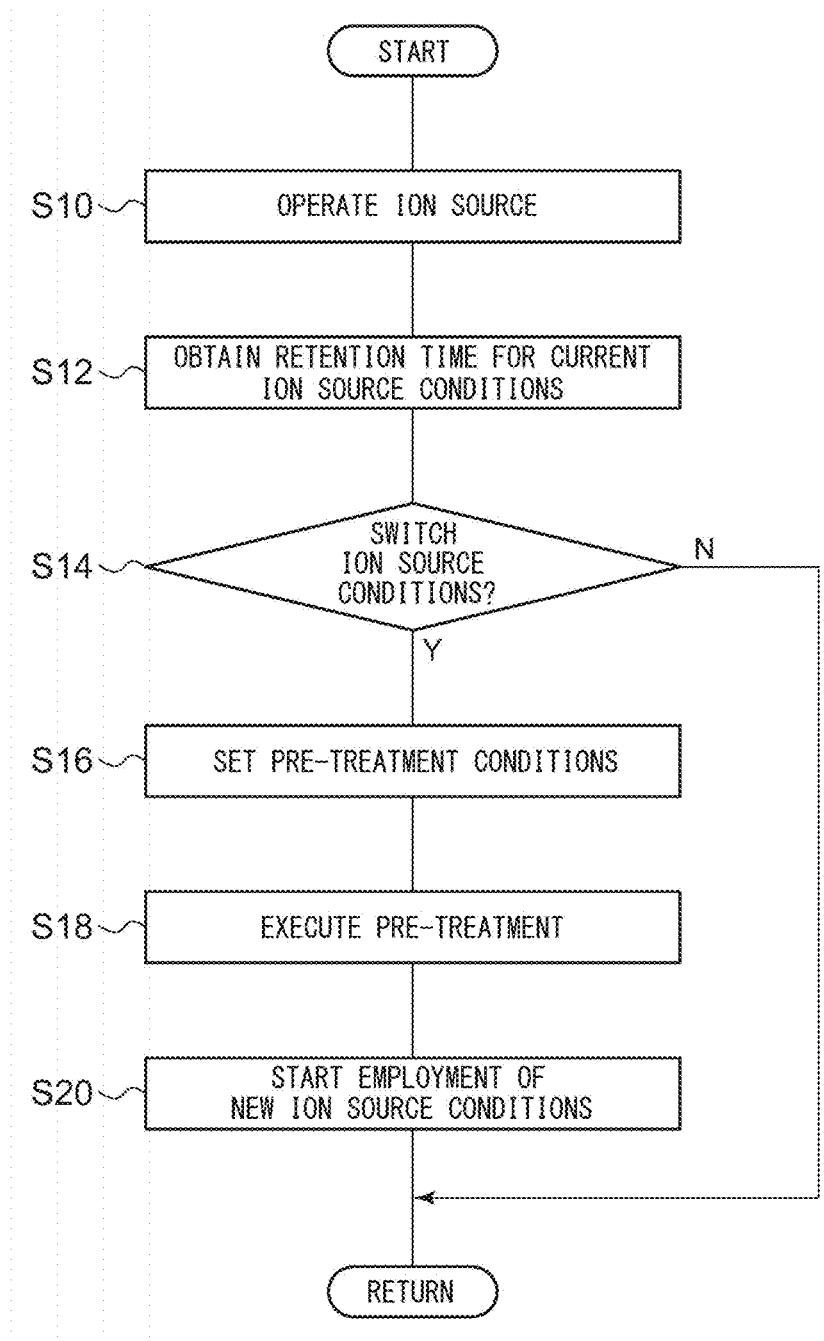
FIG. 9 schematically shows a method of controlling an ion source according to an embodiment of the present invention.

FIG. 9 schematically shows a method of controlling the ion source 12 according to an embodiment of the present invention. This method is executed by the control device 100 during the operation of the ion source 12. As shown in FIG. 9, the ion source control unit 102 controls the gas supply unit 70 and the plasma excitation source 72 in accordance with the current ion source conditions and operates the ion source 12 (S10). The current ion source conditions are input via the input unit 116 by an operator of the ion implanter 10. The input ion source conditions are given to the ion source control unit 102. Also, the input ion source conditions are output to the output unit 118 as needed.

The retention time obtaining unit 104 obtains retention time for the current ion source conditions (S12). The retention time obtaining unit 104 calculates and stores elapsed time from the start of employment of the current ion source conditions. The retention time obtaining unit 104 outputs the retention time for the current ion source conditions to the output unit 118 as needed.

The pre-treatment condition setting unit 106 determines whether or not an instruction for switching of the ion source conditions has been provided (S14). The operator of the ion implanter 10 can input via the input unit 116 the new ion source conditions to be employed subsequent to the current ion source conditions. In a case in which such an instruction for switching of the ion source conditions is provided (Y in S14), the pre-treatment condition setting unit 106 sets pre-treatment conditions based on the current ion source conditions, the retention time thereof, and the new ion source conditions (S16). The pre-treatment conditions define a pre-treatment for forming a surface layer region suitable for the new ion source conditions on the inner wall of the plasma chamber as described above. The pre-treatment condition setting unit 106 outputs the set pre-treatment conditions to the output unit 118 as needed. In a case in which no instruction for switching of the ion source conditions is provided (N in S14), employment of the current ion source conditions is continued.

Alternatively, the operator of the ion implanter 10 can input via the input unit 116 new ion beam conditions or an implantation recipe to be employed subsequent to current ion beam conditions or a current implantation recipe. In this case, the pre-treatment condition setting unit 106 may determine whether or not switching of the ion source conditions is required along with switching of the ion beam conditions or the implantation recipe.

In setting of the pre-treatment conditions, the first disablement determination unit 112 may determine whether or not the first pre-treatment setting unit 108 is disabled based on the current ion source conditions, the retention time, and/or the new ion source conditions. For example, in a case in which the current ion source conditions are conditions in which it is difficult to form a substance on the inner wall of the plasma chamber, or in a case in which the forming amount on the inner wall of the plasma chamber is sufficiently small because the retention time under the current source conditions is short, the first pre-treatment may be omitted. Also, in a case in which a substance to be formed under the current ion source conditions has a sufficiently small effect on the new ion source conditions, the first pre-treatment may be omitted.

Also, the second disablement determination unit 114 may determine whether or not the second pre-treatment setting unit 110 is disabled based on the current ion source conditions, the retention time, and/or the new ion source conditions. For example, in a case in which the current ion source conditions are conditions in which it is difficult to form a substance on the inner wall of the plasma chamber, the second pre-treatment may be omitted.

Except in the case in which the first pre-treatment setting unit 108 is disabled by the first disablement determination unit 112, the first pre-treatment setting unit 108 sets the first pre-treatment conditions based on the current ion source conditions and the retention time. Also, except in the case in which the second pre-treatment setting unit 110 is disabled by the second disablement determination unit 114, the second pre-treatment setting unit 110 sets the second pre-treatment conditions based on the new ion source conditions.

The ion source control unit 102 controls the gas supply unit 70 and the plasma excitation source 72 in accordance with the pre-treatment conditions set in this manner when the current ion source conditions are changed to the new ion source conditions. In this manner, the pre-treatment is executed (S18). When the pre-treatment is finished, the ion source control unit 102 controls the gas supply unit 70 and the plasma excitation source 72 in accordance with the new ion source conditions and operates the ion source 12. In this manner, switching of the ion source conditions is completed, and employment of the new ion source conditions is started (S20). The control device 100 may output this matter to the output unit 118 as needed.

Figure 10:
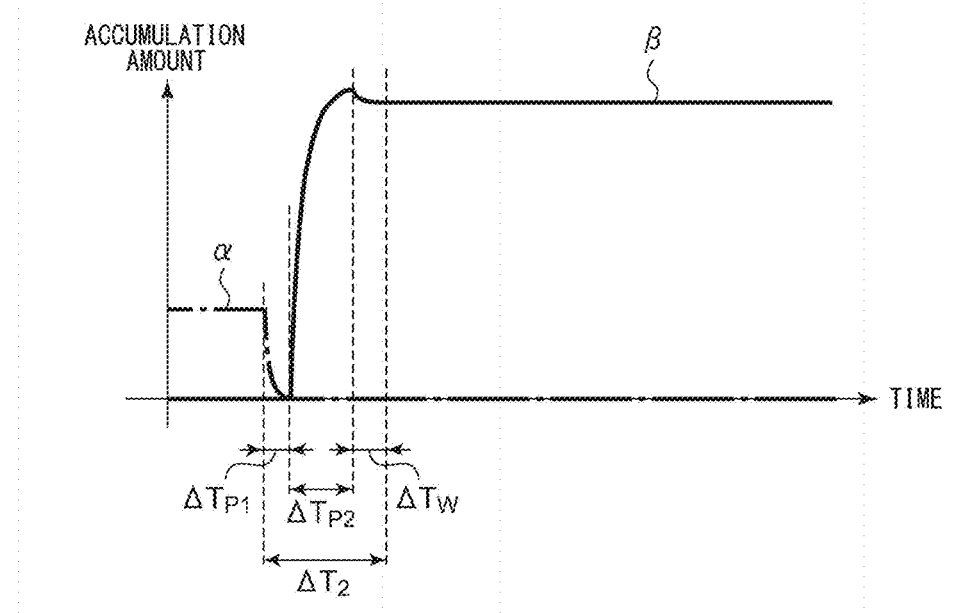
FIG. 10 shows changes of a substance forming amount on the inner wall of the arc chamber when the current ion source conditions are switched via a pre-treatment according to an embodiment of the present invention to the new ion source conditions.

FIG. 10 shows changes of the substance forming amount on the inner wall of the arc chamber 30 when the current ion source conditions are switched via the pre-treatment according to an embodiment of the present invention to the new ion source conditions. As described above, the current ion source conditions, the first pre-treatment conditions, the second pre-treatment conditions, and the new ion source conditions are automatically executed in this order. As shown in the figure, periods of time required for the first pre-treatment conditions and the second pre-treatment conditions are $\Delta Tp1$ and $\Delta Tp2$, respectively. Wait time for stabilization after the start of the new ion source conditions is $\Delta Tw$. Apparently, total wait time $\Delta T2$ ($=\Delta Tp1+\Delta Tp2+\Delta Tw$), which is the sum of these periods of time, is considerably shorter than the wait time $\Delta T1$ with no pre-treatment shown in FIG. 4.

Figure 11:
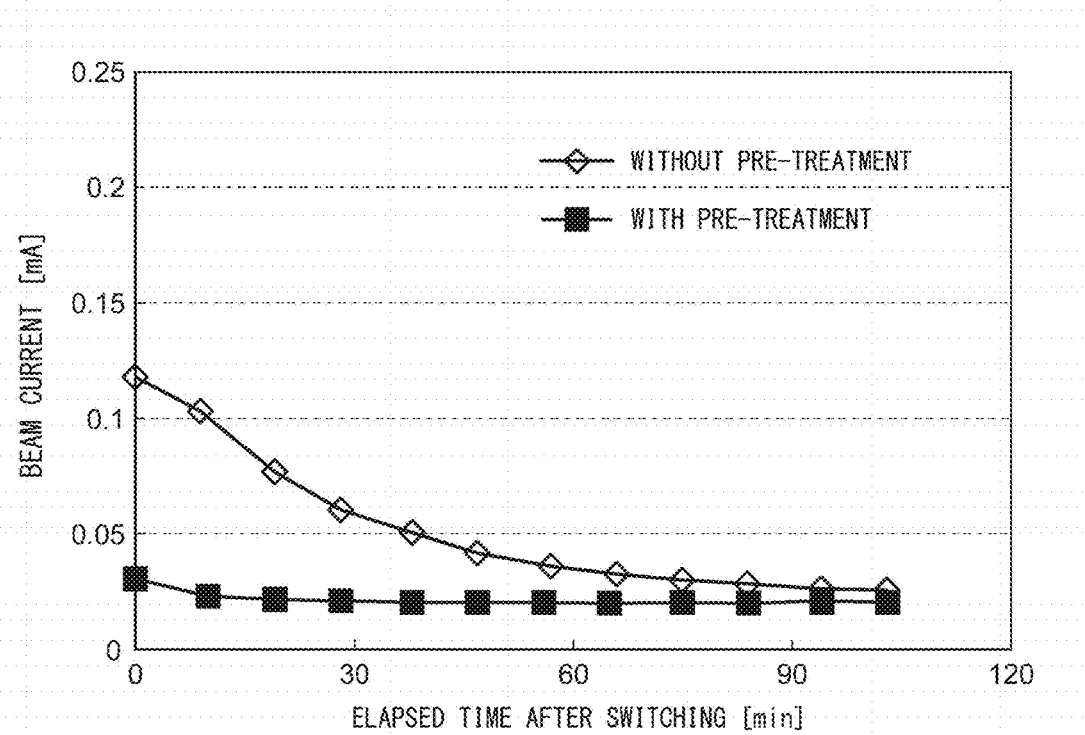
FIG. 11 shows an experimental example showing an effect of the pre-treatment according to an embodiment of the present invention.
Figure 12:
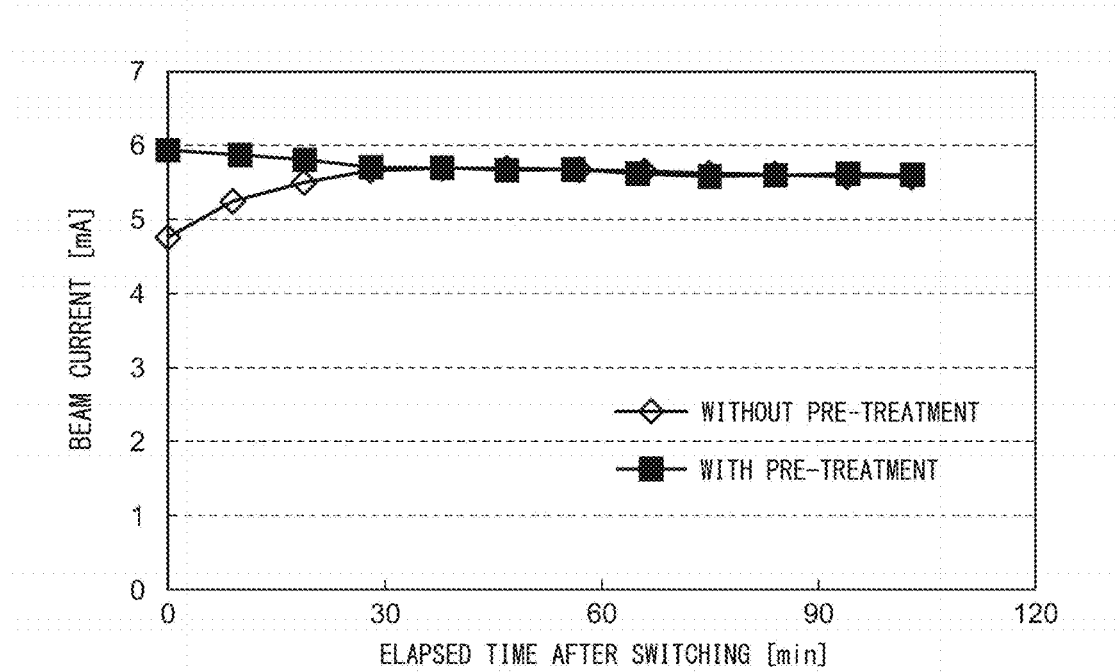
FIG. 12 shows an experimental example showing an effect of the pre-treatment according to an embodiment of the present invention.
Figure 13:
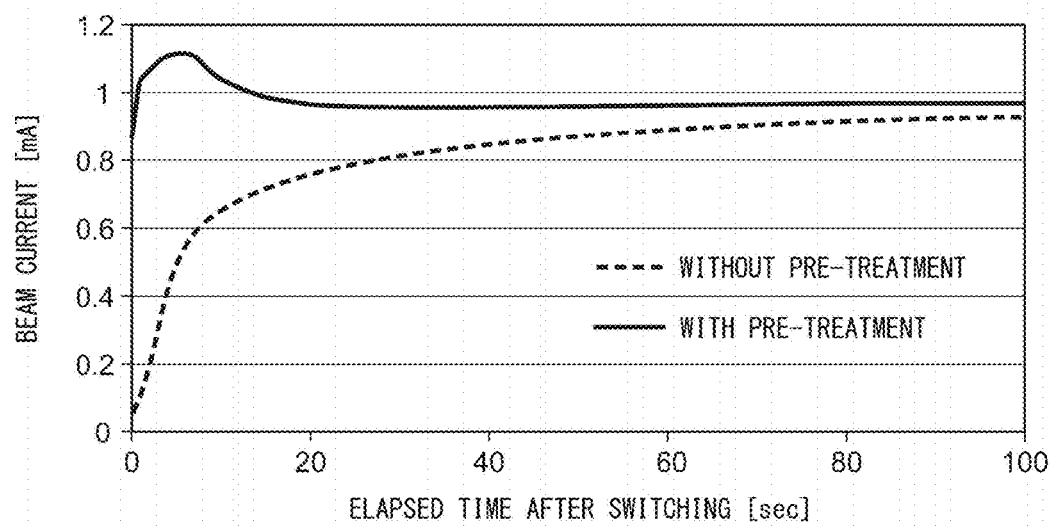
FIG. 13 shows an experimental example showing an effect of the pre-treatment according to an embodiment of the present invention.

FIGS. 11 to 13 show experimental examples showing effects of the pre-treatment according to an embodiment of the present invention. In the experimental examples in FIGS. 11 and 12, as the gas kind, $PH_3$ is used under the current ion source conditions, and $BF_3$ is used under the new ion source conditions. In the experimental example in FIG. 13, as the gas kind, $BF_3$ is used under the current ion source conditions, and $PH_3$ is used under the new ion source conditions.

FIG. 11 shows beam currents originating from the current ion source conditions to be measured after switching to the new ion source conditions. FIG. 11 shows a case in which the first pre-treatment is executed and a case in which the first pre-treatment is not executed. In the case in which the first pre-treatment is not executed, the beam current originating from the current ion source conditions, that is, a phosphorus ion beam, remains for a long time even after the start of the new ion source conditions. Conversely, in the case in which the first pre-treatment is executed, the beam current originating from the current ion source conditions is substantially negligibly-low immediately after switching to the new ion source conditions.

FIG. 12 shows beam currents under the new ion source conditions to be measured after switching to the new ion source conditions. FIG. 12 shows a case in which the first pre-treatment is executed and a case in which the first pre-treatment is not executed in a similar manner to FIG. 11. In the case in which the first pre-treatment is not executed, it takes time for the amount of the beam current under the new ion source conditions, that is, a boron ion beam, to increase. Conversely, in the case in which the first pre-treatment is executed, the stable beam current can be obtained immediately after switching to the new ion source conditions.

Meanwhile, in the experimental examples in FIGS. 11 and 12, the second pre-treatment is not executed.

FIG. 13 shows beam currents under the new ion source conditions to be measured after switching to the new ion source conditions. FIG. 13 shows a case in which the second pre-treatment is executed and a case in which the second pre-treatment is not executed. In the case in which the second pre-treatment is not executed, it takes time for the amount of the beam current under the new ion source conditions, that is, a phosphorus ion beam, to increase. Conversely, in the case in which the second pre-treatment is executed, the stable beam current can be obtained immediately after switching to the new ion source conditions. Meanwhile, in the experimental example in FIG. 13, the first pre-treatment is not executed.

As described above, at the time of switching of the ion source conditions, by executing for an optimal period of time a pre-treatment with optimal contents in accordance with ion source conditions before and after the switching, wait time for ion beam stabilization after the switching of the ion source conditions is shortened. Accordingly, productivity of the ion implanter 10 is improved.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

In the above embodiments, the extraction electrode unit 74 is configured to extract ions from the plasma chamber under the current ion source conditions and the new ion source conditions. Here, the extraction electrode unit 74 may be configured to stop extraction of ions from the plasma chamber at least either under the first pre-treatment conditions or under the second pre-treatment conditions. When high arc power is used in the first pre-treatment to raise the removing effect of the first substance $\alpha$, plasma density is too large in some cases. This may prevent normal ion beam extraction. To avoid this, the first pre-treatment may be executed without extracting the ion beam by turning off an extraction voltage. In the second pre-treatment, when low arc power is used, plasma density is too small in some cases, which may cause conditions for ion extraction to be inappropriate. To avoid this, the second pre-treatment may similarly be executed without extracting the ion beam by turning off an extraction voltage.

The current ion source conditions may be non-operation conditions such that the ion generator is unoperated. By doing so, an appropriate pre-treatment can be applied at the time of starting the operation of the ion generator (a so-called cold start). Also, the new ion source conditions may be non-operation conditions such that the ion generator is unoperated. By doing so, an appropriate pre-treatment can be applied at the time of finishing the operation of the ion generator.

The second pre-treatment conditions may be equal to the new ion source conditions.

The pre-treatment conditions may be set manually.

Although the above description is provided with reference to the indirectly heated cathode ion source, the present invention is not limited to this and may be applied to other arbitrary ion sources, such as an RF ion source, a microwave ion source, and a Bernas-type ion source, in which reactive source gas is supplied to a plasma chamber, and in which the plasma acts on the inner wall of the chamber. In this case, the term, "arc chamber," used in the above description can be replaced with "plasma chamber" used as a more generalized expression.

It should be understood that the invention is not limited to the above-described embodiment, but may be modified into various forms on the basis of the spirit of the invention. Additionally, the modifications are included in the scope of the invention.

What is claimed is:
1. An ion generator comprising:
a plasma chamber that includes a plasma chamber inner wall to be exposed to a plasma;
a gas supply unit that is configured to supply the plasma chamber with a source gas;
a plasma excitation source that is configured to excite the source gas supplied to the plasma chamber into a plasma state;
an ion source control unit that is configured to control the gas supply unit and the plasma excitation source in accordance with a current ion source condition and a new ion source condition to be employed subsequent to the current ion source condition;

a retention time obtaining unit that is configured to obtain a retention time for the current ion source condition; and a pre-treatment condition setting unit that is configured to set a pre-treatment condition defining a pre-treatment for forming on the plasma chamber inner wall a surface layer region suitable for the new ion source condition, the pre-treatment condition being set based on the current ion source condition, the retention time, and the new ion source condition, wherein the ion source control unit is configured to control the gas supply unit and the plasma excitation source in accordance with the pre-treatment condition when the current ion source condition is changed to the new ion source condition.

2. The ion generator according to claim 1, wherein the pre-treatment condition setting unit comprises:

a first pre-treatment setting unit that is configured to set a first pre-treatment condition defining a first pre-treatment for removing from the plasma chamber inner wall by a reaction with the plasma a first substance formed on the plasma chamber inner wall under the current ion source condition, the first pre-treatment condition being set based on the current ion source condition and the retention time; and a second pre-treatment setting unit that is configured to set a second pre-treatment condition defining a second pre-treatment for pre-forming on the plasma chamber inner wall by a reaction with the plasma a second substance to be formed on the plasma chamber inner wall under the new ion source condition, the second pre-treatment condition being set based on the new ion source condition.

3. The ion generator according to claim 2, wherein the first pre-treatment condition includes a first supply power for plasma excitation and a kind of first source gas, and the first supply power is higher than a supply power under the current ion source condition, and/or the first source gas is different from a source gas to be used under the current ion source condition.

4. The ion generator according to claim 3, wherein the first source gas is noble gas, halogen, or mixed gas containing noble gas or halogen.

5. The ion generator according to claim 2, wherein the second pre-treatment condition includes a second supply power for plasma excitation, and a kind and a flow rate of second source gas, and the second supply power is lower than a supply power under the new ion source condition, and/or the second source gas is a source gas to be used under the new ion source condition, and/or the flow rate of the second source gas is higher than a flow rate of the source gas to be used under the new ion source condition.

6. The ion generator according to claim 5, wherein the second source gas is a gas containing phosphorus.

7. The ion generator according to claim 2, wherein the pre-treatment condition setting unit comprises a first disablement determination unit that is configured to determine whether or not the first pre-treatment setting unit is disabled based on the current ion source condition, the retention time, and/or the new ion source condition.

8. The ion generator according to claim 2, wherein the pre-treatment condition setting unit comprises a second disablement determination unit that is configured to determine whether or not the second pre-treatment setting unit is disabled based on the current ion source condition, the retention time, and/or the new ion source condition.

9. The ion generator according to claim 2, further comprising:

an extraction electrode unit that is configured to extract ions from the plasma chamber under the current ion source condition and the new ion source condition, wherein the extraction electrode unit is configured to stop extraction of ions from the plasma chamber at least either under the first pre-treatment condition or under the second pre-treatment condition.

10. The ion generator according to claim 1, wherein the current ion source condition is a non-operation condition such that the ion generator is unoperated.

11. The ion generator according to claim 1, wherein the new ion source condition is a non-operation condition such that the ion generator is unoperated.

12. A method of controlling the ion generator according to claim 1, the method comprising:

controlling the gas supply unit and the plasma excitation source in accordance with a current ion source condition;

obtaining a retention time for the current ion source condition;

setting a pre-treatment condition defining a pre-treatment for forming on the plasma chamber inner wall a surface layer region suitable for a new ion source condition to be employed subsequent to the current ion source condition, the pre-treatment condition being set based on the current ion source condition, the retention time, and the new ion source condition; and controlling the gas supply unit and the plasma excitation source in accordance with the pre-treatment condition when the current ion source condition is changed to the new ion source condition.

* * * * *